(12) United States Patent
Yamaji et al.

(10) Patent No.: US 8,507,998 B2
(45) Date of Patent: Aug. 13, 2013

(54) SEMICONDUCTOR DEVICE

(75) Inventors: Masaharu Yamaji, Matsumoto (JP); Akio Kitamura, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/408,101

(22) Filed: Feb. 29, 2012

(65) Prior Publication Data

US 2012/0161246 A1 Jun. 28, 2012

Related U.S. Application Data

(62) Division of application No. 12/210,775, filed on Sep. 15, 2008, now Pat. No. 8,148,785.

(30) Foreign Application Priority Data

Sep. 14, 2007 (JP) ................................. 2007-238924

(51) Int. Cl.
*H01L 29/76* (2006.01)

(52) U.S. Cl.
USPC ..... 257/392; 257/360; 257/371; 257/E29.109

(58) Field of Classification Search
USPC ................... 257/368, 369, 371, 392, E29.109
See application file for complete search history.

(56) References Cited

U.S. PATENT DOCUMENTS

| 5,581,107 A | 12/1996 | Kawamura et al. |
| 6,653,694 B1 | 11/2003 | Osanai |
| 2006/0103434 A1 | 5/2006 | Okamoto et al. |
| 2007/0188149 A1 | 8/2007 | Miyamoto |

FOREIGN PATENT DOCUMENTS

| JP | 2000-133722 A | 5/2000 |
| JP | 2002-170886 A | 6/2002 |
| JP | 2003-031678 A | 1/2003 |
| JP | 2006-029923 A | 2/2006 |
| JP | 2006-172687 A | 6/2006 |
| JP | 2007-218688 A | 8/2007 |

OTHER PUBLICATIONS

Office Action issued in Japanese Patent Application 2007-238924 dated Sep. 25, 2012. Partial English translation provided.
JP Office Action issued Jan. 15, 2013 for corresponding JP2007-238924 (Partial English translation provided).

*Primary Examiner* — Matthew E Warren
(74) *Attorney, Agent, or Firm* — Rossi, Kimms & McDowell LLP

(57) ABSTRACT

A semiconductor device can output a reference voltage for an arbitrary potential and can detect the voltage of each cell in a battery including multiple cells very precisely. The device includes a depletion-type MOSFET 21 and an enhancement type MOSFET 22, and has a floating structure that isolates depletion-type MOSFET 21 and enhancement type MOSFET 22 from a ground terminal. The depletion-type MOSFET 21 and enhancement type MOSFET 22 are connected in series to each other, wherein the depletion-type MOSFET 21 is connected to high-potential-side terminal and the enhancement type MOSFET 22 is connected to low-potential-side terminal. The semiconductor device having the configuration described above is disposed in a voltage detecting circuit section in a control IC for a battery including multiple cells.

4 Claims, 7 Drawing Sheets

US 8,507,998 B2

SEMICONDUCTOR DEVICE

CROSS REFERENCE TO RELATED APPLICATIONS

This is a divisional application of U.S. patent application Ser. No. 12/210,775, filed Sep. 15, 2008, for which benefit is claimed, and status is pending, which in turn claims priority from JP Application No. 2007-238924, filed Sep. 14, 2007, the contents of both applications of which is incorporated herein by reference.

BACKGROUND

The present invention relates to a semiconductor device. Specifically, the invention relates to a semiconductor device for outputting a reference voltage.

According to the prior art, a reference voltage circuit is used for feeding a reference voltage to all the control circuits in an integrated circuit (hereinafter referred to as an "IC"). Therefore, the reference voltage circuit is required to always output a certain voltage not adversely affected by temperature variations nor by power supply voltage variations. FIG. 6 is a cross sectional view of a semiconductor device that constitutes a conventional MOS reference voltage circuit. The semiconductor device shown in FIG. 6 is manufactured employing p-type substrate 1. In the surface portion of p-type substrate 1, p-type well layer 73 is formed. Depletion-type MOSFET 101 and enhancement-type MOSFET 102 are formed in the surface portion of p-type well player 73. Depletion-type MOSFET 101 and enhancement-type MOSFET 102 are spaced apart from each other by field oxide film 17 (See, for example, Unexamined Laid Open Japanese Patent Application Publication No. 2003-31678).

In depletion-type MOSFET 101, n+-type drain layer 5 and n+-type source layer 6 are formed in a first surface portion of p-type well player 73 such that n+-type drain layer 5 and n+-type source layer 6 are spaced apart from each other. In the first surface portion of p-type well player 73, $n_-$-type depletion layer 7 is formed such that n--type depletion layer 7 is in contact with $n^+$-type drain layer 5 and n+-type source layer 6. Gate electrode 10 is formed above n--type depletion layer 7 with gate oxide film 9 interposed between n--type depletion layer 7 and gate electrode 10.

In enhancement-type MOSFET 102, $n^+$-type drain layer 11 and $n^+$-type source layer 12 are formed in a second surface portion of p-type well player 73 such that $n^+$-type drain layer 11 and $n^+$-type source layer 12 are spaced apart from each other. In the second surface portion of p-type well player 73, p-type channel layer 13 is formed such that p-type channel layer 13 is in contact with $n^+$-type drain layer 11 and $n^+$-type source layer 12. Gate electrode 16 is formed above p-type channel layer 13 with gate oxide film 15 interposed between p-type channel layer 13 and gate electrode 16. In a third surface portion of p-type well player 73, $p^+$-type pickup layer 74 is formed. Pickup layer 74 is spaced apart from enhancement-type MOSFET 102 by field oxide film 19.

High-potential power supply terminal Vcc is connected electrically to $n^+$-type drain layer 5 in depletion-type MOSFET 101. Output terminal Vref that outputs a reference voltage is connected electrically to $n^+$-type source layer 6 and gate electrode 10 in depletion-type MOSFET 101 and to $n^+$-type drain layer 11 and gate electrode 16 in enhancement-type MOSFET 102. Ground terminal GND is connected electrically to $n^+$-type source layer 12 in enhancement-type MOSFET 102 and $p^+$-type pickup layer 74. The MOS reference voltage circuit as described above makes it possible to detect the cell voltage of a lithium ion battery including, for example, one battery cell very precisely.

Now the configuration of a voltage detecting circuit, which employs the conventional semiconductor device for a MOS reference voltage circuit, will be described below. FIG. 7 is a block circuit diagram describing the configuration of a voltage detecting circuit that uses the conventional semiconductor device for the MOS reference voltage circuit thereof. In FIG. 7, voltage detecting circuit 110 includes high resistance R1, resistance R2, and voltage detecting circuit section 112. Voltage detecting circuit section 112 includes comparator 114 and MOS reference voltage circuit 113. The reference voltage outputted from MOS reference voltage circuit 113 is applied to the reference voltage side of comparator 114. The voltage obtained by dividing the output voltage from a lithium ion battery, including lithium battery cells 111 connected in series, with resistance R1 and resistance R2 is applied to the input potential side of comparator 114.

As described above, a high voltage is divided by resistance to a lower voltage and the lower voltage is compared with a reference voltage to detect the high voltage. Alternatively, a high voltage is divided by a differential amplifier circuit to a lower voltage and the lower voltage is compared with a reference voltage to detect the high voltage.

However, a large voltage difference is caused between a battery voltage and a reference voltage level, to which the battery voltage is lowered, in the voltage detecting circuit section in a charging control IC for a battery including many cells. The large voltage difference makes it hard to detect the battery voltage with high precision. Since only one reference voltage circuit is included, it is impossible to detect the voltage of every cell.

In view of the foregoing, it would be desirable to obviate the problem described above, and to provide a semiconductor device that facilitates outputting a reference voltage for an arbitrary potential. It would further be desirable to provide a semiconductor device that facilitates detecting the voltage of every cell in the battery with high precision.

SUMMARY OF THE INVENTION

The invention provides a semiconductor device that obviates the above-described problem, facilitates outputting a reference voltage for an arbitrary potential, and further facilitates detecting the voltage of every cell in the battery with high precision.

In one preferred embodiment of the invention, a semiconductor device is provided that includes a substrate of a first conductivity type, a first well layer of a second conductivity type disposed in the surface portion of the substrate, a second well layer of the first conductivity type disposed in the surface portion of the first well layer, a third well layer of the first conductivity type disposed in the surface portion of the first well layer, the third well layer being spaced apart from the second well layer, a depletion-type MOSFET disposed in the second well layer; and an enhancement-type MOSFET disposed in the third well layer.

Further, the invention provides a semiconductor device including a substrate of a first conductivity type, a buried layer of a second conductivity type on the substrate, an epitaxial layer of the first conductivity type on the buried layer, a first well layer of the second conductivity type disposed in the surface portion of the epitaxial layer, a second well layer of the first conductivity type disposed in the surface portion of the first well layer, a third well layer of the first conductivity type disposed in the surface portion of the first well layer, the third well layer being spaced apart from the second well layer, a depletion-type MOSFET disposed in the second well layer; and an enhancement-type MOSFET disposed in the third well layer.

In a further preferred embodiment, in the above semiconductor devices include, the depletion-type MOSFET a first drain layer of the second conductivity type disposed in the surface portion of the second well layer, a first source layer of the second conductivity type disposed in the surface portion of the second well layer, the first source layer being spaced apart from the first drain layer, a depletion layer of the second conductivity type disposed in the surface portion of the second well layer, the depletion layer being in contact with the first drain layer and the first source layer, a first pickup layer of the first conductivity type disposed in the surface portion of the second well layer, and a first gate electrode above the depletion layer with a first gate oxide film interposed between the depletion layer and the first gate electrode.

Still further, in the above semiconductor devices, the enhancement-type MOSFET includes a second drain layer of the second conductivity type disposed in the surface portion of the third well layer, a second source layer of the second conductivity type disposed in the surface portion of the third well layer, the second source layer being spaced apart from the second drain layer, a channel layer of the first conductivity type disposed in the surface portion of the third well layer, the channel layer being in contact with the second drain layer and the second source layer, a second pickup layer of the first conductivity type disposed in the surface portion of the third well layer, and a second gate electrode above the channel layer with a second gate oxide film interposed between the channel layer and the second gate electrode.

The semiconductor devices of the present invention further preferably include an output terminal connected electrically to the first gate electrode, the first source layer, the second gate electrode and the second drain layer, a high-potential-side terminal connected electrically to the first drain layer; and a low-potential-side terminal connected electrically to the first pickup layer, the second source layer and the second pickup layer.

The semiconductor device of the present invention feeds a reference voltage to the reference-potential-side of a comparator that compares the voltage of each cell in a battery including a plurality of the cell with the reference voltage.

The semiconductor device according to the invention has a floating structure, in which the depletion-type MOSFET and the enhancement-type MOSFET are isolated from the ground terminal. Therefore, the semiconductor device used for a reference voltage circuit facilitates detecting the voltage of each cell in the battery including a plurality of the cell. Since each cell voltage is compared with a reference voltage, it is effective to divide the voltage of each cell by low resistance. Therefore, the error caused by voltage drop is reduced and voltage detection can be conducted very precisely.

The semiconductor device according to the invention can output a reference voltage for an arbitrary potential. The semiconductor device according to the invention can detect the voltage of every cell constituting a battery very precisely.

BRIEF DESCRIPTION OF THE DRAWINGS

The invention will now be described in greater detail with reference to certain preferred embodiments thereof and the accompanying figures, wherein.

DESCRIPTION OF THE PREFERRED EMBODIMENTS

Figure 1:
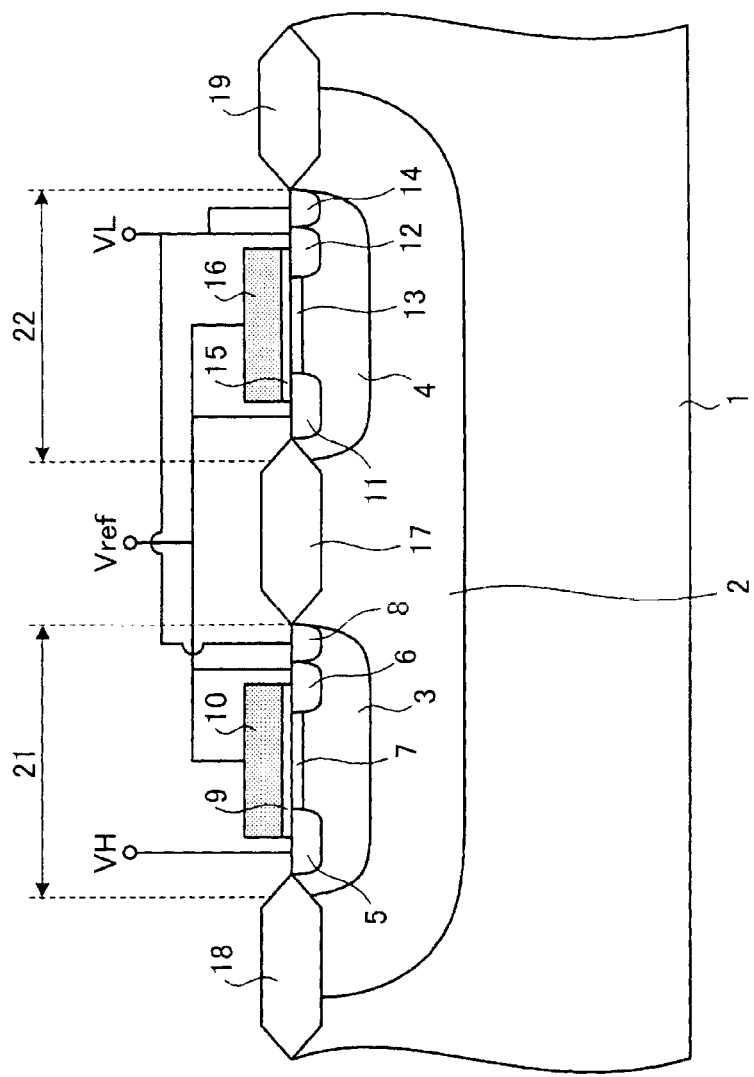
FIG. 1 is a cross sectional view of a semiconductor device according to a first embodiment of the invention.
Figure 2:
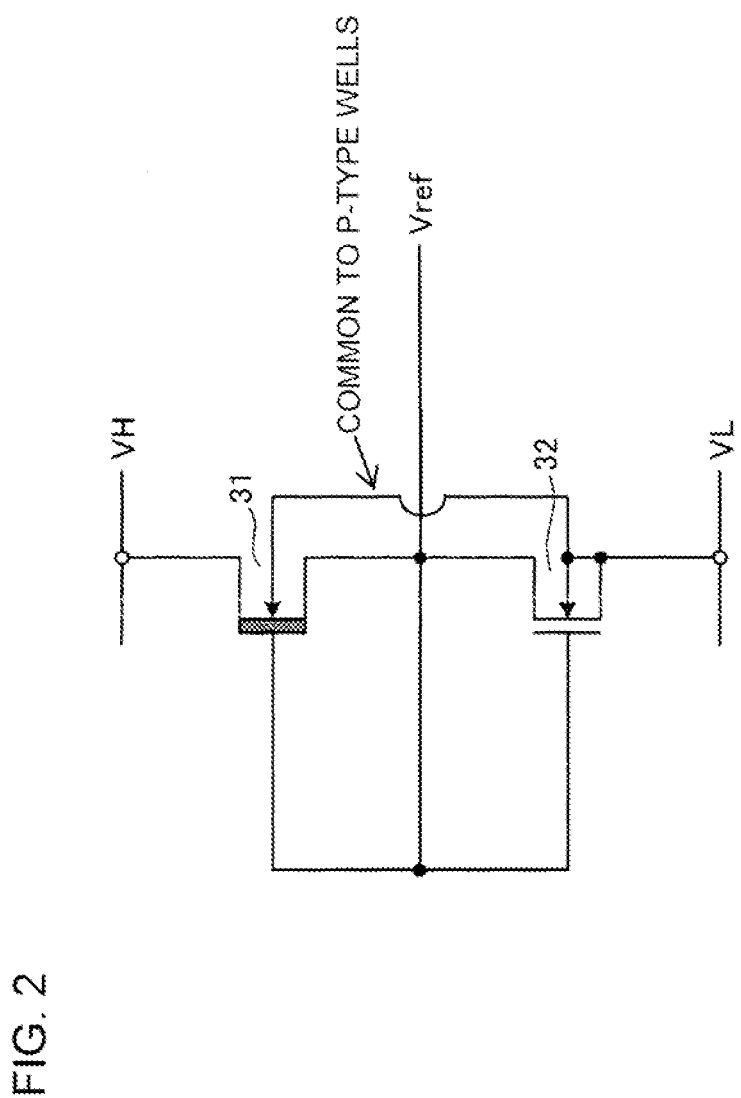
FIG. 2 is a circuit diagram showing the circuit configuration of the semiconductor device according to the first embodiment of the invention.

FIG. 1 is a cross sectional view of a semiconductor device according to a first embodiment of the invention. FIG. 2 is a circuit diagram showing the circuit configuration of the semiconductor device according to the first embodiment.

Referring now to FIG. 1, n-type well layer 2 is formed in the surface portion of p-type substrate 1. The n-type well layer 2 works as a floating layer. In the surface portion of n-type well player 2, p-type well layer 3 and p-type well layer 4 are formed such that p-type well layer 3 and p-type well layer 4 are spaced apart from each other. Depletion-type NMOSFET 21 is formed in the surface portion of p-type well player 3. Enhancement-type NMOSFET 22 is formed in the surface portion of p-type well player 4.

In depletion-type NMOSFET 21, $n^+$-type drain layer 5 and $n^+$-type source layer 6 are formed in the surface portion of p-type well layer 3 such that $n^+$-type drain layer 5 and $n^+$-type source layer 6 are spaced apart from each other. In the surface portion of p-type well layer 3, $n^-$-type depletion layer 7 is formed such that $n^-$-type depletion layer 7 is in contact with $n^+$-type drain layer 5 and $n^+$-type source layer 6. An impurity such as phosphorus ($P_{31}$) is doped in $n^-$-type depletion layer 7. In the surface portion of p-type well layer 3, $p^+$-type pickup layer 8 is also formed. Gate electrode 10 is formed above $n^-$-type depletion layer 7 with gate oxide film 9 interposed between $n^-$-type depletion layer 7 and gate electrode 10. For example, gate oxide film 9 is 170 Å in thickness.

In enhancement-type NMOSFET 22, $n^+$-type drain layer 11 and $n^+$-type source layer 12 are formed in the surface portion of p-type well layer 4 such that $n^+$-type drain layer 11 and $n^+$-type source layer 12 are spaced apart from each other. In the surface portion of p-type well layer 4, $p^-$-type channel layer 13 is formed such that $p^-$-type channel layer 13 is in contact with $n^+$-type drain layer 11 and $n^+$-type source layer 12. In the surface portion of p-type well layer 4, $p^+$-type pickup layer 14 is also formed. Gate electrode 16 is formed above $p^-$-type channel layer 13 with gate oxide film 15 interposed between $p^-$-type channel layer 13 and gate electrode 16. For example, gate oxide film 15 is 170 Å in thickness.

Field oxide film 17 is formed in the surface portion of n-type well layer 2 such that field oxide film 17 spaces apart depletion-type NMOSFET 21 and enhancement-type NMOSFET 22 from each other. Field oxide film 18 isolates depletion-type NMOSFET 21 from the other devices not shown. Field oxide film 19 isolates enhancement-type NMOSFET 22 from the other devices not shown.

Output terminal Vref is connected electrically to $n^+$-type source layer 6 and gate electrode 10 in depletion-type NMOS- FET 21 and to n+-type drain layer 11 and gate electrode 16 in enhancement-type NMOSFET 22. High-potential-side terminal VH is connected electrically to n+-type drain layer 5 in depletion-type NMOSFET 21. Low-potential-side terminal VL is connected electrically to p+-type pickup layer 8 in depletion-type NMOSFET 21 and to n+-type source layer 12 and p+-type pickup layer 14 in enhancement-type NMOSFET 22.

Now the method for manufacturing a MOS reference voltage circuit according to the first embodiment of the invention will be described below. First, n-type well layer 2 is formed in the surface portion of p-type substrate 1. Then, field oxide films 17, 18 and 19 are formed. In the surface portion of n-type well layer 2, p-type well layers 3 and 4 are formed. Then, n−-type depletion layer 7 is formed in the surface portion of p-type well layer 3. Depletion layer 7 is doped, for example, with phosphorus ($P_{31}$). Then, gate oxide film 9 of, for example, 170 in thickness is formed on n−-type depletion layer 7. Further, gate electrode 10 is deposited on gate oxide film 9.

In p-type well layer 4, p−-type channel layer 13 is formed. Then, gate oxide film 15 of, for example, 170 Å in thickness is formed on p−-type channel layer 13. Further, gate electrode 16 is deposited on gate oxide film 15.

Shielding masks are formed on the portions of p-type well layers 3 and 4, in which any n+-type layer will not be formed. Then, n+-type drain layers 5, 11 and n+-type source layers 6, 12 are formed by implanting n-type impurity ions over gate electrode 10, 16 and field oxide films 17, 18, 19. Shielding masks are formed on the portions of p-type well layers 3 and 4, in which any p+-type layer will not be formed. Then, p+-type pickup layers 8 and 14 are formed by implanting p-type impurity ions over gate electrodes 10, 16 and field oxide films 17, 18, 19.

Then, output terminal Vref is connected electrically to n+-type source layer 6 and gate electrode 10 in depletion-type NMOSFET 21 and to n+-type drain layer 11 and gate electrode 16 in enhancement-type NMOSFET 22. High-potential-side terminal VH is connected electrically to n+-type drain layer 5 in depletion-type NMOSFET 21. Low-potential-side terminal VL is connected electrically to p+-type pickup layer 8 in depletion-type NMOSFET 21 and to n+-type source layer 12 and p+-type pickup layer 14 in enhancement-type NMOSFET 22. In FIG. 2, depletion-type NMOSFET 31 and enhancement-type NMOSFET 32 are shown.

Figure 3:
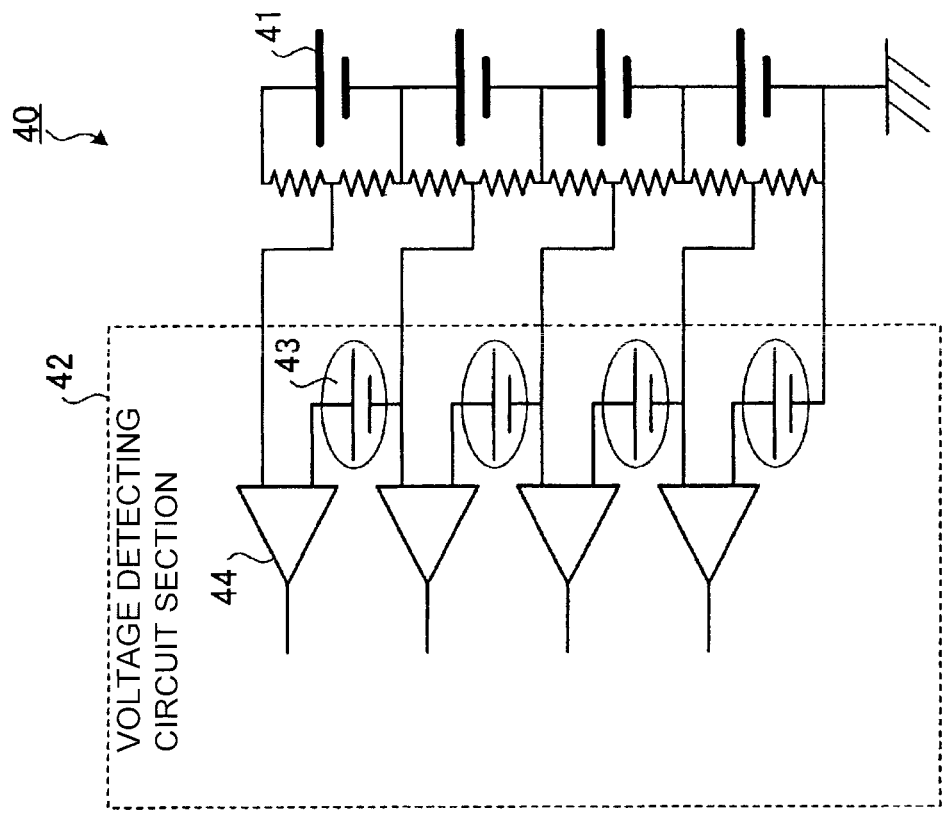
FIG. 3 is a block circuit diagram describing the configuration of a voltage detecting circuit that uses the semiconductor device according to the first embodiment of the invention.

FIG. 3 is a block circuit diagram describing the configuration of a voltage detecting circuit that uses the semiconductor device according to the first embodiment of the invention. As shown in FIG. 3, voltage detecting circuit section 42 in voltage detecting circuit 40 includes comparators 44 connected to respective lithium battery cells 41, and MOS reference voltage circuits 43 which feed reference voltages to respective comparators 44. MOS reference voltage circuit 43 is configured by the semiconductor device shown in FIGS. 1 and 2.

If the cell voltage of each lithium battery cell 41 is 4.0 V, the high-potential-side voltage of the battery, which includes four lithium battery cells 41 as shown in FIG. 3, will be 16 V. MOS reference voltage circuit 43 according to the first embodiment is connected to the reference-potential-side of each lithium battery cell 41. Therefore, it is effective to divide the voltage difference of 4.0 V and to feed the divided voltage difference to the input-potential-side of each comparator 44.

Since comparator 44 is disposed for every lithium battery cell 41 in the MOS reference voltage circuit according to the first embodiment, the voltage of every lithium battery cell 41 is detectable. When the battery includes four lithium battery cells, the error caused by the resistance for dividing the high-voltage cell potential and for obtaining a low voltage is suppressed to be ¼ the error caused in the conventional voltage detecting circuit including one comparator. Therefore, the voltage of every cell in the battery including many battery cells is detected very precisely according to the first embodiment of the invention.

Figure 7:
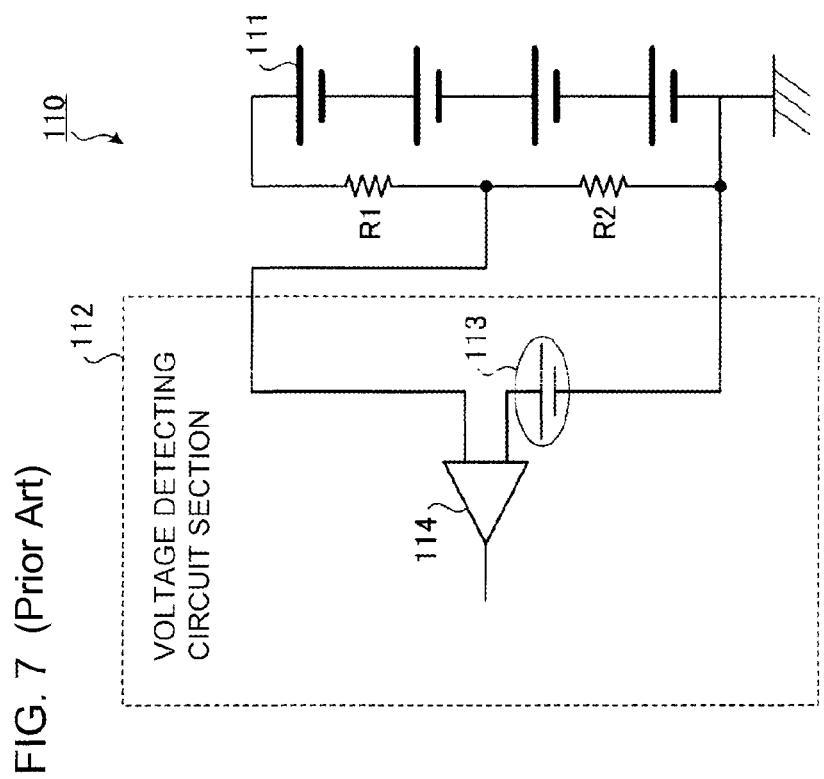
FIG. 7 is a block circuit diagram describing the configuration of a voltage detecting circuit that uses the conventional semiconductor device.

In detail, when the battery includes four lithium battery cells 41, the voltage for over-charge detection is different by the magnitude of several tens mV from maker to maker according to the prior art. Further, for trimming the detected charging voltage finely, it is necessary for voltage dividing resistance R1 (cf. FIG. 7) to be 16 MΩ to 20 MΩ. In contrast, for dividing the voltage of each cell according to the invention, it is enough for the voltage dividing resistance to be 4 MΩ to 5 MΩ. Therefore, the error caused by the voltage dividing resistance according to the invention is ¼ the error caused according to the prior art.

As described above, the precision, with which the voltage of the battery including many cells is detected, is improved and the safety of battery charging is improved. According to the first embodiment, the circuit for detecting the voltages of the respective cells included in a battery can be configured on one chip.

Figure 4:
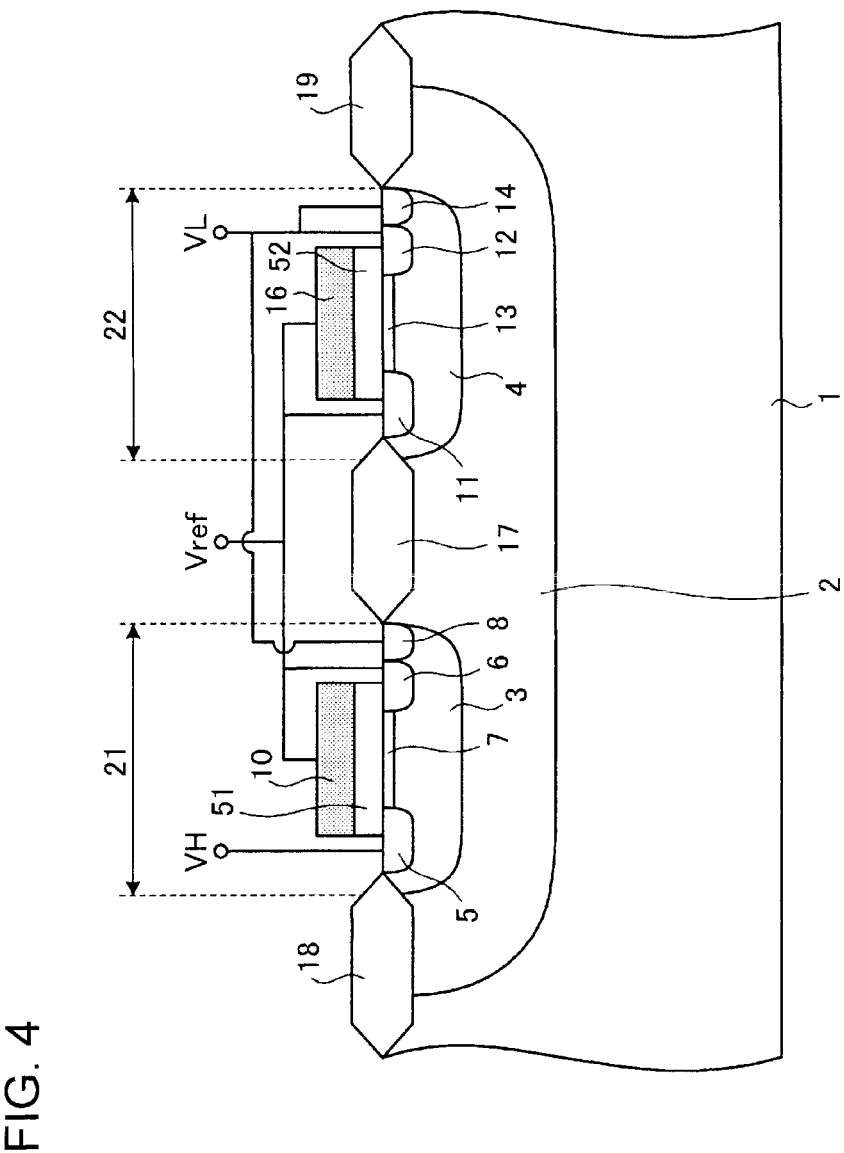
FIG. 4 is a cross sectional view of a semiconductor device according to a second embodiment of the invention.

FIG. 4 is a cross sectional view of a semiconductor device according to a second embodiment of the invention. The semiconductor device according to the second embodiment is different from the semiconductor device according to the first embodiment in that gate oxide films 51 and 52 thereof are around 300 in thickness. Generally, the recommended operating voltage per the thickness of a gate oxide film in the MOSFET is from 3.0 MV/cm to 3.3 MV/cm. Therefore, the gate oxide film is 300 Å in thickness for sustaining the breakdown voltage of around 10 V.

The semiconductor device according to the second embodiment facilitates detecting a voltage very precisely when it is required for the semiconductor device to exhibit a breakdown voltage of around 10 V.

Figure 5:
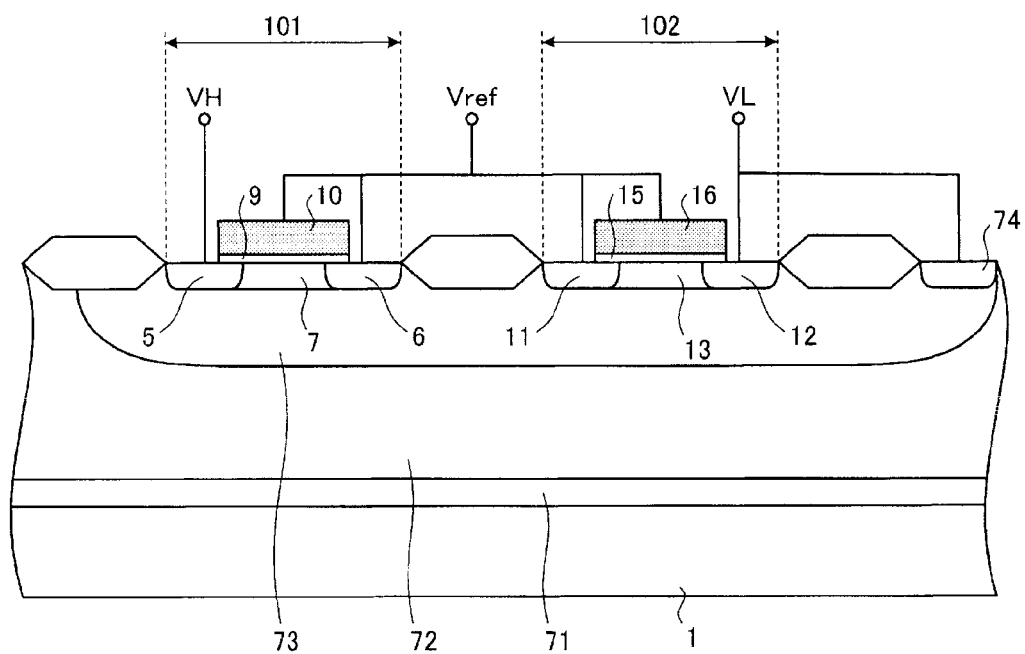
FIG. 5 is a cross sectional view of a semiconductor device according to a third embodiment of the invention.
Figure 6:
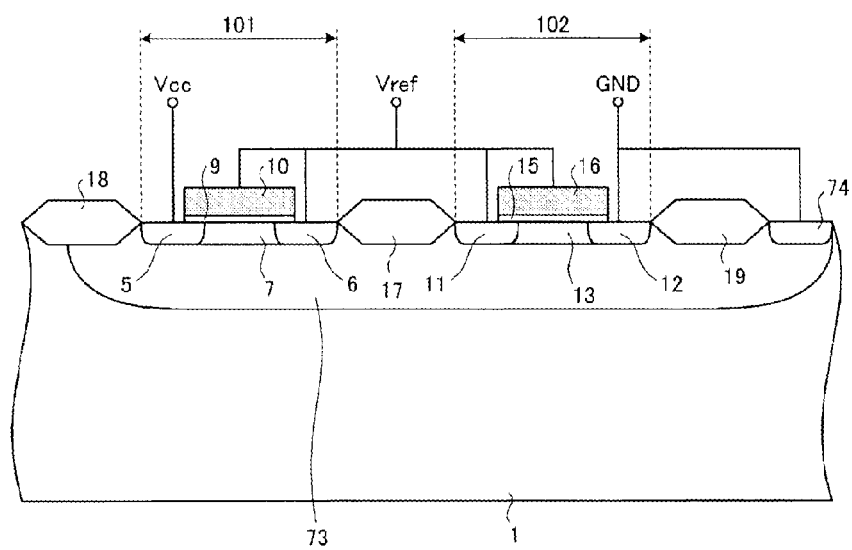
FIG. 6 is a cross sectional view of a semiconductor device that constitutes a conventional MOS reference voltage circuit.

FIG. 5 is a cross sectional view of a semiconductor device according to a third embodiment of the invention. The semiconductor device according to the third embodiment is different from the semiconductor devices according to the first and second embodiments in that the semiconductor device according to the third embodiment is manufactured using an epitaxial substrate. As shown in FIG. 5, the epitaxial substrate includes n-type buried layer 71 on p-type substrate 1, and p-type epitaxial layer 72 laminated on n-type buried layer 71. Epitaxial layer 72 works as a floating layer. In the surface portion of p-type epitaxial layer 72, p-type well layer 73 is formed. In the surface portion of p-type well layer 73, depletion-type NMOSFET 101 and enhancement-type NMOSFET 102 are formed such that depletion-type NMOSFET 101 and enhancement-type NMOSFET 102 are spaced apart from each other.

By making the potential of p-type epitaxial layer 72 float, the semiconductor device according to the third embodiment obtains the effects similar to the effects which the semiconductor devices according to the first and second embodiments exhibit.

As described above, the semiconductor device according to the invention is very useful for a reference voltage circuit. Especially, the semiconductor device according to the invention is suitable for a voltage detecting circuit for detecting the voltage of a battery such as a lithium ion battery.

This application is based on, and claims priority to, Japanese Patent Application No: 2007-238924, filed on Sep. 14, 2007. The disclosure of the priority application, in its entirety, including the drawings, claims, and the specification thereof, is incorporated herein by reference.

What is claimed is:

1. A semiconductor device comprising:
a substrate of a first conductivity type;
a buried layer of a second conductivity type on the substrate;
an epitaxial layer of the first conductivity type on the buried layer;
a first well layer of the second conductivity type disposed in a surface portion of the epitaxial layer;
a second well layer of the first conductivity type disposed in a surface portion of the first well layer;
a third well layer of the first conductivity type disposed in the surface portion of the first well layer, the third well layer being spaced apart from the second well layer;
a depletion-type MOSFET disposed in the second well layer; and
an enhancement-type MOSFET disposed in the third well layer;
wherein the depletion-type MOSFET comprises:
 a first drain layer of the second conductivity type disposed in a surface portion of the second well layer;
 a first source layer of the second conductivity type disposed in the surface portion of the second well layer, the first source layer being spaced apart from the first drain layer;
 a depletion layer of the second conductivity type disposed in the surface portion of the second well layer, the depletion layer being in contact with the first drain layer and the first source layer;
 a first pickup layer of the first conductivity type disposed in the surface portion of the second well layer; and
 a first gate electrode above the depletion layer with a first gate oxide film interposed between the depletion layer and the first gate electrode;
wherein the enhancement-type MOSFET comprises:
 a second drain layer of the second conductivity type disposed in a surface portion of the third well layer;
 a second source layer of the second conductivity type disposed in the surface portion of the third well layer, the second source layer being spaced apart from the second drain layer;
 a channel layer of the first conductivity type disposed in the surface portion of the third well layer, the channel layer being in contact with the second drain layer and the second source layer;
 a second pickup layer of the first conductivity type disposed in the surface portion of the third well layer; and
 a second gate electrode above the channel layer with a second gate oxide film interposed between the channel layer and the second gate electrode;
the semiconductor device further comprising:
 an output terminal connected electrically to the first gate electrode, the first source layer, the second gate electrode and the second drain layer;
 a high-potential-side terminal connected electrically to the first drain layer; and
 a low-potential-side terminal connected electrically to the first pickup layer, the second source layer and the second pickup layer.

2. The semiconductor device according to claim 1, wherein the semiconductor device feeds a reference voltage to a reference-potential-side of a comparator that compares a voltage of each cell in a battery comprising a plurality of the cell with the reference voltage.

3. A semiconductor device comprising:
a substrate of a first conductivity type;
a buried layer of a second conductivity type on the substrate;
an epitaxial layer of the first conductivity type on the buried layer;
a first well layer of the first conductivity type disposed in a surface portion of the epitaxial layer;
a depletion-type MOSFET disposed in the first well layer; and
an enhancement-type MOSFET disposed in the first well layer, the enhancement-type MOSFET being spaced apart from the depletion-type MOSFET.

4. The semiconductor device according to claim 3, wherein the depletion-type MOSFET comprises:
a first drain layer of the second conductivity type disposed in a surface portion of the first well layer;
a first source layer of the second conductivity type disposed in the surface portion of the first well layer, the first source layer being spaced apart from the first drain layer;
a depletion layer of the second conductivity type disposed in the surface portion of the first well layer, the depletion layer being in contact with the first drain layer and the first source layer;
a first gate electrode above the depletion layer with a first gate oxide film interposed between the depletion layer and the first gate electrode; and
wherein the enhancement-type MOSFET comprises:
a second drain layer of the second conductivity type disposed in a surface portion of the first well layer;
a second source layer of the second conductivity type disposed in the surface portion of the first well layer, the second source layer being spaced apart from the second drain layer;
a channel layer of the first conductivity type disposed in the surface portion of the first well layer, the channel layer being in contact with the second drain layer and the second source layer;
a second gate electrode above the channel layer with a second gate oxide film interposed between the channel layer and the second gate electrode;
a first pickup layer of the first conductivity type disposed in the surface portion of the first well layer; and
an output terminal connected electrically to the first gate electrode, the first source layer, the second gate electrode and the second drain layer;
a high-potential-side terminal connected electrically to the first drain layer; and
a low-potential-side terminal connected electrically to the first pickup layer, the second source layer.

* * * * *